United States Patent [19]
Fackler et al.

[11] Patent Number: 6,167,344
[45] Date of Patent: Dec. 26, 2000

[54] PROCESS FOR OPERATING A CONTROLLER WITH A PROGRAMMABLE MEMORY

[75] Inventors: Rupert Fackler, Pleidelsheim; Carsten Franz, Markgröningen, both of Germany

[73] Assignee: Robert Bosch GmbH, Stuttgart, Germany

[21] Appl. No.: 08/981,430

[22] PCT Filed: Mar. 15, 1997

[86] PCT No.: PCT/DE97/00530

§ 371 Date: Mar. 19, 1998

§ 102(e) Date: Mar. 19, 1998

[87] PCT Pub. No.: WO97/40502

PCT Pub. Date: Oct. 30, 1997

[30] Foreign Application Priority Data

Apr. 23, 1996 [DE] Germany .................... 196 16 053

[51] Int. Cl.[7] .................. G06F 19/00; G06G 7/70
[52] U.S. Cl. .................. 701/115; 701/115; 701/1; 714/5; 713/1
[58] Field of Search .................. 701/1, 29, 33, 701/35, 102, 115; 365/195; 713/1; 714/5, 23

[56] References Cited

U.S. PATENT DOCUMENTS

| | | | |
|---|---|---|---|
| 4,117,974 | 10/1978 | Ciarmella | 235/304 |
| 4,675,513 | 6/1987 | Kuze | 235/375 |
| 4,791,661 | 12/1988 | Donaldson et al. | 379/96 |
| 5,278,759 | 1/1994 | Berra et al. | 364/424.01 |
| 5,327,531 | 7/1994 | Bealkowski et al. | 395/164 |
| 5,712,969 | 1/1998 | Zimmermann et al. | 395/182.03 |
| 5,787,040 | 7/1998 | Leon et al. | 365/189.01 |
| 5,826,075 | 10/1998 | Bealkowski et al. | 395/600 |
| 5,826,205 | 10/1998 | Koelle et al. | 701/29 |

OTHER PUBLICATIONS

2244 Research Disclosure Jun. (1989), No. 302, Emsworth, GB, "EEPRPM Erase and Write Security For Electronic Control Systems".

Primary Examiner—Ly V. Hua
Assistant Examiner—Robert G. Crockett
Attorney, Agent, or Firm—Walter Ottesen

[57] ABSTRACT

A method is described for operating a control apparatus having a programmable memory unit wherein the programming of the memory unit takes place with a sequential execution of a multiplicity of memory programming control operations. The described method is characterized in that: a check step S1 is provided with the aid of which it can be determined whether all, selected individual or several of the memory programming control operations, which must be then have been carried out and a decision step S2 is provided, in which, while considering the check result, a decision is made as to whether the programming operation should be continued as prescribed by executing further memory programming control operations.

8 Claims, 1 Drawing Sheet

PROCESS FOR OPERATING A CONTROLLER WITH A PROGRAMMABLE MEMORY

FIELD OF THE INVENTION

The present invention relates to a method for operating a control apparatus having a programmable memory unit. The programming of the memory unit takes place with a sequential execution of a plurality of memory programming control operations.

BACKGROUND OF THE INVENTION

A method of this kind is, for example, disclosed in DE 43 32 499 A1. The control apparatus described in this publication is a motor vehicle control apparatus having programmable memory units in the form of flash EPROMs. The memory units are, stated more precisely, erasable nonvolatile memory units. The use of flash EPROMs gains increasingly in significance because they incorporate the advantages of a normal EPROM (high memory cell density in a small space) and an EEPROM (electric and therefore simple and convenient erasing of memory content).

For initial programming, that is, erasing and/or overwriting the flash EPROMs (preferably, in dependence upon motor vehicle type in the motor vehicle manufacturing facility) or, for later reprogramming the same (during customer service for removal of defects or appropriate individual customer wishes), an external programming apparatus, for example, in the form of a personal computer, is connected to the control apparatus. With a programming apparatus of this kind, the execution of control programs stored in the control apparatus for erasing and overwriting data in the flash EPROM is initiated and, if required, the newly stored data are made available.

A series of protective mechanisms, which has to be overcome, is provided to prevent a deliberate misuse or an inadvertent erasure or overwriting of data in the flash EPROM. Accordingly, for example, first the external programming apparatus must be connected to the control apparatus and a corresponding communication must be initiated before even the corresponding control program in the control apparatus can be activated to erase and/or overwrite contents of the flash EPROMs. During the execution of the corresponding control program itself, there are still various hurdles to be overcome in order to establish the preconditions that the flash EPROM can be programmed or erased (for example, the flash EPROM must be unlocked by applying predetermined address and/or data combinations in advance of programming the same).

Even though a plurality of measures is provided in order to prevent an inadvertent or misuse erasure or overwriting of data in the flash EPROM, this can nonetheless take place because of a chain of unfortunate circumstances.

The cause of the above are, most of all, disturbances or malfunctions of the control apparatus and/or of the programming apparatus which, for example, can be caused by hardware faults, EMF incident radiation or, under circumstances, by targeted manipulation for misuse purposes.

SUMMARY OF THE INVENTION

It is an object of the invention to improve a method in that an erasure and/or overwriting (which is triggered by disturbances and/or is deliberate) of data, which are stored in a programmable memory unit, can be precluded in a simple manner.

Accordingly, a checking step and a decision step are provided. In the checking step, it can be determined whether all, selected individual or several of the memory programming control operations have been carried out. In the decision step, a decision is made while considering the checking results as to whether the programming operation is to be continued while executing further memory programming control operations.

The provision of these steps makes possible, at any desired time point, a check as to whether all or at least the essential ones of the control operations (which have been carried out according to directives) have actually been carried out or, in lieu thereof, for example, have been omitted or were carried out incompletely or too frequently. If one establishes as the most important control operations those control operations which permit the decision to be made as to whether the control sequence (stated more precisely, the sequence of the triggering and the execution of erasure or overwriting the programmable memory unit) took place as set forth up to the time point considered, then the check result in the decision step can be applied for making a decision as to whether the start and/or the execution of the erasure or overwriting of the programmable memory unit has taken place as provided therefor or was triggered by a disturbance or malfunction or was deliberately caused.

In dependence upon the decision, which was made in the decision step, the further operation of the control apparatus can be individually determined. For the case that, in the decision step, a determination was made that a condition, which was checked in the checking step, is not satisfied (that is, one or several memory programming control operations were not executed as prescribed or were at least not properly executed), it appears to be appropriate to prevent the normal (prescribed) continuation of the memory programming control operations. Otherwise, no reason is present to intervene.

By providing the above-mentioned method steps, a method was provided via which an erasure, which is influenced or triggered by disturbances, and/or an overwriting of data, which are stored in a programmable memory unit, is substantially precluded in a simple manner.

BRIEF DESCRIPTION OF THE DRAWING

The invention will be explained in greater detail with respect to an embodiment.

The FIG. 1 shows a sequence plan of an embodiment of the method of the invention.

DESCRIPTION OF THE PREFERRED EMBODIMENTS OF THE INVENTION

Figure 1:
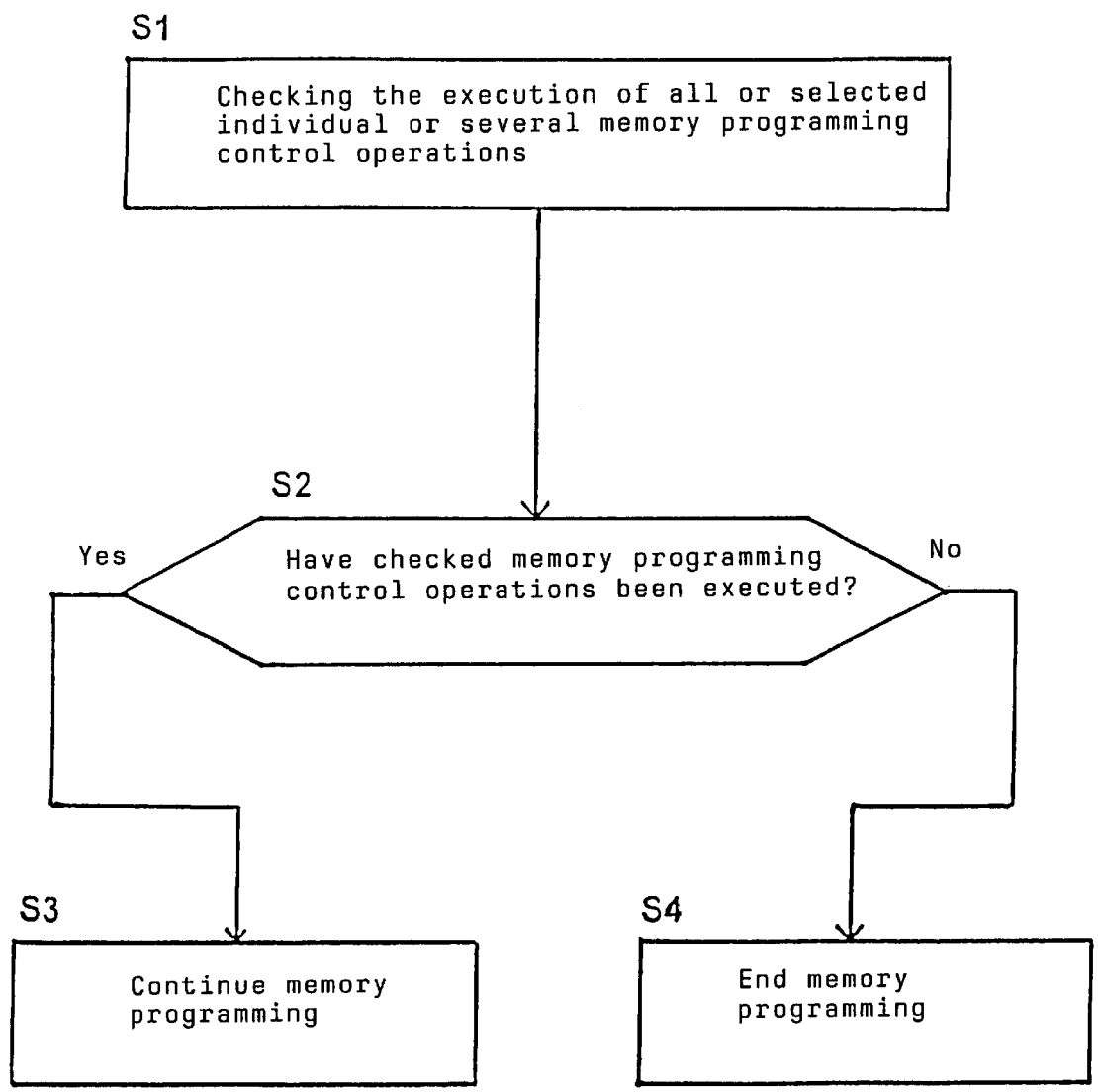

The explanations which follow relate to a method for operating a control apparatus, especially a control apparatus for controlling, for example, the engine, the transmission or the brakes, et cetera of a motor vehicle, that is, a motor vehicle control apparatus.

The control apparatus contains a programmable memory unit, stated more precisely, erasable nonvolatile memory units in the form of flash EPROMs, the special advantages of which for this area of application have already been initially mentioned.

The programming of the memory units takes place via an external programming apparatus which can be connected to the motor vehicle control apparatus via a serial interface.

The present invention is, however, not limited to the programming of flash EPROMs in motor vehicle control apparatus utilizing an external programming apparatus.

Rather, the invention is applicable anywhere where a memory unit of a control apparatus is to be programmed by a programming arrangement.

The programming, more precisely, the erasure and/or the overwriting of the memory unit takes place via a sequential execution of memory programming control operations which will be explained in greater detail later.

The execution of the memory programming control operations, which (if no disturbance is present) is triggered essentially by the external programming apparatus, takes place while processing control programs which are stored in the control apparatus. The memory unit, which is used to store the control programs, can be the flash EPROM, which is under discussion, but does not have to be the flash EPROM.

When calling up the above-mentioned control program, this program is loaded into a work memory assigned to a control unit such as a microprocessor, microcontroller or the like and is executed by processing by the control unit.

In order to be able to prevent that an inadvertent or misuse or a improper execution of the control program takes place (that is, an erasure, which is triggered by disturbances and/or is deliberately caused, and/or an overwriting of data stored in a programmable memory unit), a processing monitoring is carried out, for example, by executing a sequence monitoring program which can be seen in the figure and is described in detail in the following.

In a step S1 of the process monitoring program, which is shown in the FIGURE, a check of the execution of all or selected individual or several memory programming control operations takes place.

The memory programming control operations (the execution therefor which is preferably to be checked) are especially checking routines which, in turn, check the presence of predetermined conditions.

The conditions, which are to be checked by the checking routines, are, in the present embodiment, above all such conditions the non-observance of which can lead to malfunctions, that is, in the case under consideration, especially to an erasure (which is inadvertent and/or a misuse) and/or overwriting of the flash EPROM.

In the present embodiment, five conditions (condition 1 to condition 5) were selected as conditions to be checked and are described in detail below.

The condition 1, which is to be checked, relates to the application of a so-called programming voltage to a corresponding input terminal of the control apparatus. When checking this condition 1 by the corresponding check routine, it is determined whether the programming voltage is applied.

The application of the above-mentioned programming voltage to the control apparatus is one of the measures via which the external programming apparatus signals to the control apparatus and/or to the flash EPROM that a programming or reprogramming of the flash EPROM should take place. If and as long as the above-mentioned programming voltage is not applied to the control apparatus, then it is appropriate for reasons of safety, independently of the other circumstances, to not undertake a programming (reprogramming) or an erasure of the flash EPROM by executing a corresponding sequence control.

To further increase the safety, consideration can be given not only to check the application of a desired voltage other than zero to the corresponding input terminal of the control apparatus but to evaluate simultaneously the magnitude of the applied voltage (if present) in order to consider a voltage as being properly applied only when this voltage does not drop below a lower limit value or exceed an upper limit value.

The condition 2, which is to be checked, relates to the initialization of the control apparatus. For checking this condition via the corresponding check routine, a determination is made as to whether the control apparatus is initialed in a manner provided for a programming of the flash EPROM.

The control apparatus under view can be in various operating modes which determine differently the function and/or mode of operation of the control apparatus. To erase and/or overwrite the flash EPROM, a special operating mode is provided which distinguishes from the normal operating mode and perhaps from further operating modes of the control apparatus, inter alia, in that the special operating mode supports erasure and/or overwriting of the flash EPROM. The entry of the control apparatus into this special operating mode requires a special initialization of the control apparatus. If and as long as an initialization of this kind of the control apparatus is not executed, then it is appropriate for reasons of safety, and independently of other circumstances, to decline programming (reprogramming) or erasing the flash EPROM by undertaking a corresponding sequence control.

The condition 3, which is to be checked, relates to the communication between the control apparatus and the external programming apparatus. In a check of this condition by the corresponding check routine, it is determined whether an interface protocol is active which makes possible the proper communication.

The control apparatus and the external programming apparatus are, in the present embodiment, connected via a serial interface. The communication via this interface requires a special control and monitoring which can be effected by activating a so-called interface protocol. If and as long as the corresponding interface protocol is not active, a proper communication between the control apparatus and the external programming apparatus is not possible and, for reasons of safety, it is in this case, independent of other circumstances, appropriate to decline a programming (reprogramming) or an erasure of the flash EPROM by undertaking an appropriate sequence control.

The condition 4, which is to be checked, relates to the presence of a request from the external programming apparatus to erase and/or overwrite the flash EPROM. In a check of this condition by the corresponding check routine, it is determined whether such a requirement is present.

To erase and/or overwrite the flash EPROM it is not sufficient that the control apparatus and the external programming apparatus be brought into the corresponding operating mode and are able to communicate with each other. For this purpose, there has to be instead an explicit request of the programming apparatus to the control apparatus. If, and for as long as a request of this kind is not present, it is for reasons of safety, and independently of other circumstances, appropriate to decline programming (reprogramming) or erasing the flash EPROM by undertaking a corresponding sequence control.

The above discussed conditions 1 to 4 relate essentially to the external triggering of the control apparatus to program (reprogram) or to erase the flash EPROM.

The condition 5, which is now to be checked, relates to the sequence of the erasure and/or overwriting of the flash EPROM itself as well as to the measures which are directly associated therewith. During the check of this condition by the corresponding check routine, a determination is made as to whether the sequence of the control operation, which is required herefor, takes place in the prescribed manner.

The measures for erasing and/or overwriting the flash EPROM as well as the measures which are directly related thereto, must be undertaken at specific time points and/or in a specific sequence and/or in a specific frequency. If there are deviations in the sequence of the corresponding control operations from the prescribed normal case, then for reasons of safety and independently of other circumstances, it is appropriate to decline programming (reprogramming) or an erasure of the flash EPROM via an appropriate corresponding sequence control.

The conditions 1 to 5 (as already mentioned in the corresponding explanations) have in common that the sequence, the duration and the number of executions of the memory programming control operations is dependent upon these conditions.

The conditions 1 to 5 (as already mentioned) are checked by means of check routines and as often as required and for as long as desired and at desired time points. The execution of these check routines is, in turn, checked in step S1 of the sequence monitoring program shown in the FIGURE.

The check routines (or as expressed more generally), the memory programming control operations, the execution of which is to be checked in step S1, are configured so that measures are undertaken during the execution thereof on the basis of which it can be checked at any desired later time point as to whether, and if required, how often, how long and when an execution has taken place.

A measure of this kind can, for example, comprise that an assigned identification (flag) is set or erased.

Another possibility is that the count of a counter is changed. The type and the extent of the count change of each memory programming control operation (whose execution is checked in step S1) can be individually fixed and can, as required (for maximizing the safety), in addition, be made dependent upon as to how often, and for how long and at which time point, an execution of a particular memory programming control operation takes place.

The check executed in step S1 takes place with an individual evaluation of the corresponding identifications and/or counter readings.

In step S2, a decision is made as to whether the memory programming control operations (whose execution was checked in step S1) has actually (and as prescribed) been executed.

A branching takes place in dependence upon the decision result in step S2 either to a step S3 or to a step S4.

A branching to step S3 takes place if, in step S2, a decision is made that the memory programming control operations (whose execution is checked in step S1) had been executed or executed as prescribed. The branching to step S3 has the consequence that the memory programming is continued, that is, the control program to make other triggerings for the memory programming and for executing the memory programming is further processed as prescribed.

A branching to step S4 takes place when, in step S2, a decision is made that the memory program control operations (whose execution is checked in step S1) were not or not properly (for example, only partially) executed. The branching to step S4 has the consequence that the memory programming is ended, that is, the control program to make further triggerings for the memory programming and for executing the memory program is moved out of, preferably in a defined manner.

The execution of the described sequence monitoring program can, for example, be triggered by the control program which effects the execution of the memory programming control operations and, preferably, as a closing check directly before the erasure and/or overwriting of the flash EPROM.

In addition, or alternatively, it can be provided that the execution of the described sequence monitoring program is triggered in response to specific occurrences (interrupt control).

The memory programming control operations, which can be monitored by step S1, can be checked independently of the triggering of the sequence monitoring individually or in any desired group and evaluated. Each of the memory programming control operations can be made, independently of the other programming control operations, as often as desired (under circumstances, not at all) and at any desired time point for the subject matter of the described check and evaluation as long as the particular time points lie only in advance of the actual programming (reprogramming) or erasure of the flash EPROM.

Alternatively or in addition to the above-described measures, it can be provided that data, from the content of which the erasure and/or overwriting of the content of the flash EPROM can be made dependent, are not stored in the control apparatus so as to be freely accessible at any time; instead, only after establishing the communication between the control apparatus and the external programming apparatus (see the above explained condition 3) and upon triggering of the external programming apparatus via the programming apparatus itself or the control apparatus the data can be written at a location provided herefor in a volatile memory of the control apparatus.

The above-mentioned data can, for example, be those data and address values which, at least for some flash EPROMs, must be given in advance of the actual erasure and/or overwriting in the form of so-called unlock cycles via the bus to the flash EPROM.

If the execution of these unlock cycles is so configured that the data values and address values, which are applied to the execution thereof, are taken from the mentioned provided location in the volatile memory of the control apparatus, the flash EPROM cannot be unlocked and therefore cannot be programmed before, in response to triggering of the external control apparatus, the corresponding data are transferred to the location provided herefor.

The provision of the above-described measures makes it possible that an erasure and/or overwriting (triggered by disturbances and/or deliberately caused) of data, which are stored in a programmable memory unit, can be substantially precluded in a simple manner.

What is claimed is:
1. A method for operating a control apparatus having a programmable memory unit, the programming of the memory unit taking place with a sequential execution of a multiplicity of memory programming control operations, the method comprising:
  executing a check step S1 via which it can be determined whether all, selected individual or several of the memory programming control operations have been carried out which must by then have been carried out;
  executing a decision step S2, in which, while taking into account the check results, a decision is made as to whether the programming operation should be contin- ued as prescribed by executing further memory programming control operations; and, the execution of the memory programming control operations takes place by processing control programs and that the check as to whether a memory programming control operation has been executed is effected via a check as to whether the assigned control program or the assigned control program segment was run through.

2. The method of claim 1, wherein the control programs, the execution of which can be checked by the check step S1, effect a change of the counter reading of a counter in addition to the execution of the actual control operation.

3. Method of claim 1, wherein the control programs, the execution of which can be checked by the check step S1, effect a setting or erasure of an assigned identifier in addition to carrying out the actual control operation.

4. The method of claim 1, wherein the programming of the memory unit is only effected or continued if or as long as it is detected that a predetermined voltage is applied to an input terminal of the control apparatus by an external programming apparatus or a corresponding control operation for monitoring the control apparatus is or has been carried out.

5. The method of claim 1, wherein the programming of the memory unit is only then effected or continued if or as long as it is detected that an initialization, which normally precedes a programming of the memory unit, has been made or a corresponding control operation for monitoring said control apparatus is or has been carried out.

6. The method of claim 1, wherein the programming of the memory unit is only effected or continued if or as long as it is detected that a communication between the control apparatus and an external programming apparatus is in process while maintaining a predetermined protocol or is started or a corresponding control operation for monitoring the control apparatus is executed or has been executed.

7. The method of claim 1, wherein the programming of the memory unit is only effected or continued if or as long as it is detected that a corresponding request of an external programming apparatus is present or a corresponding control operation for monitoring the external control apparatus is or has been carried out.

8. The method of claim 1, wherein addresses and data, which are to be applied to corresponding terminals of the memory unit in advance of programming for unlocking the memory unit, are read into a volatile memory of the control apparatus only after the start of a communication between the control apparatus and an external programming apparatus.

* * * * *